(12) United States Patent
Taniguchi

(10) Patent No.: US 6,518,861 B2
(45) Date of Patent: Feb. 11, 2003

(54) SURFACE ACOUSTIC WAVE FILTER FORMED WITH A RIPPLE AT THE HIGH FREQUENCY SHOULDER OF THE PASS BAND

(75) Inventor: Norio Taniguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/808,683

(22) Filed: Mar. 15, 2001

(65) Prior Publication Data

US 2001/0013817 A1 Aug. 16, 2001

Related U.S. Application Data

(62) Division of application No. 09/435,580, filed on Jan. 31, 2000, now Pat. No. 6,265,808.

(30) Foreign Application Priority Data

Nov. 24, 1998 (JP) .......................................... 10-333279

(51) Int. Cl.$^7$ .............................. H03H 9/64; H03H 3/08
(52) U.S. Cl. ................... 333/193; 310/313 B; 333/195; 29/25.35
(58) Field of Search ................................ 333/193–195; 310/313 R, 313 B, 313 C, 313 D; 29/25, 35

(56) References Cited

U.S. PATENT DOCUMENTS 6,172,580 B1 * 1/2001 Taniguchi et al. .......... 333/193
6,292,071 B1 * 9/2001 Taniguchi ................... 333/133

FOREIGN PATENT DOCUMENTS

| JP | 6-232682 | * 8/1994 | ................. 333/195 |
| JP | 9-55640 | 2/1997 | |
| JP | 10-242799 | * 9/1998 | |

* cited by examiner

Primary Examiner—Benny Lee
Assistant Examiner—Barbara Summons
(74) Attorney, Agent, or Firm—Keating & Bennett, LLP (57) ABSTRACT

A surface acoustic wave filter has a plurality of interdigital transducers arranged in a ladder circuit structure. Each of the interdigital transducers has a first comb-shaped electrode and a second comb-shaped electrode, each of which has a plurality of electrode fingers and a bus bar connected to first ends of the plurality of electrode fingers. The first and second comb-shaped electrodes interdigitate with each other so that second ends of the plurality of electrode fingers of the first comb-shaped electrode extend toward the bus bar of the second comb-shaped electrode. A gap is created in at least one of the interdigital transducers to cause a ripple in the pass band of the surface acoustic wave filter such that the ripple increases the steepness of the filter characteristics at the high frequency shoulder of the pass band. The gap is defined between the bus bar of the first comb-shaped electrode and the second ends of the plurality of electrode fingers of the second comb-shaped electrode. The gap width should be in the range of about 0.50 λ to about 4 λ, wherein λ is a wavelength of a surface acoustic wave to be excited on the piezoelectric substrate.

5 Claims, 11 Drawing Sheets

SURFACE ACOUSTIC WAVE FILTER FORMED WITH A RIPPLE AT THE HIGH FREQUENCY SHOULDER OF THE PASS BAND

This application is a Divisional of U.S. Patent Application No. 09/435,580 filed Jan. 31, 2000, now U.S. Pat. No. 6,265,808.

BACKGROUND OF THE INVENTION

1. Field of the Invention

The present invention relates to a surface acoustic wave filter for use as, for example, a band pass filter. More specifically, the present invention relates to a structure of a surface acoustic wave filter (SAW filter), in which a plurality of one-port surface acoustic wave resonators (SAW resonators) are connected so as to define a ladder circuit, and a method of manufacturing thereof.

2. Description of the Background Art

Conventionally, a SAW filter has been widely used as a band pass filter. For example, in Japanese Examined Patent Publication No. 56-19765, there is provided a SAW filter having an arrangement such that a plurality of one-port SAW resonators are arranged to constitute a ladder circuit.

Figure 11:
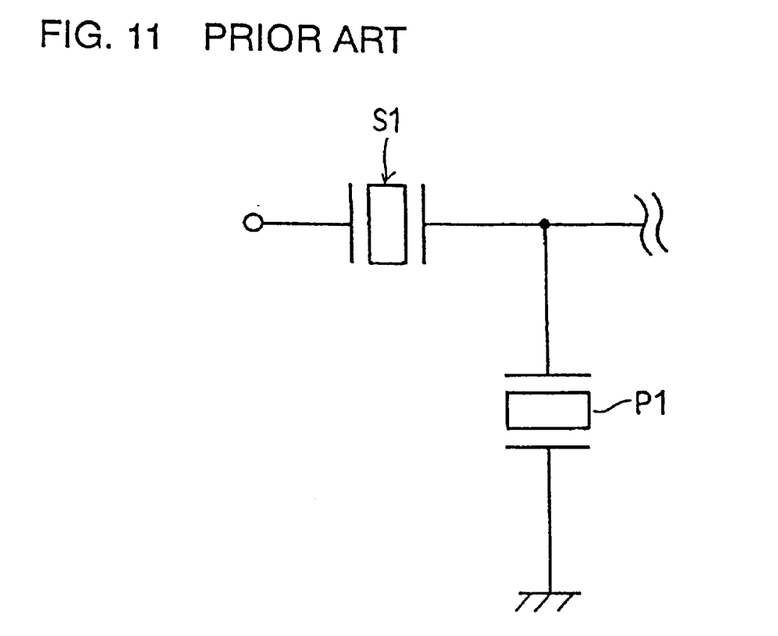
FIG. 11 is a circuit diagram of a conventional SAW filter having a ladder circuit structure.
Figure 12:
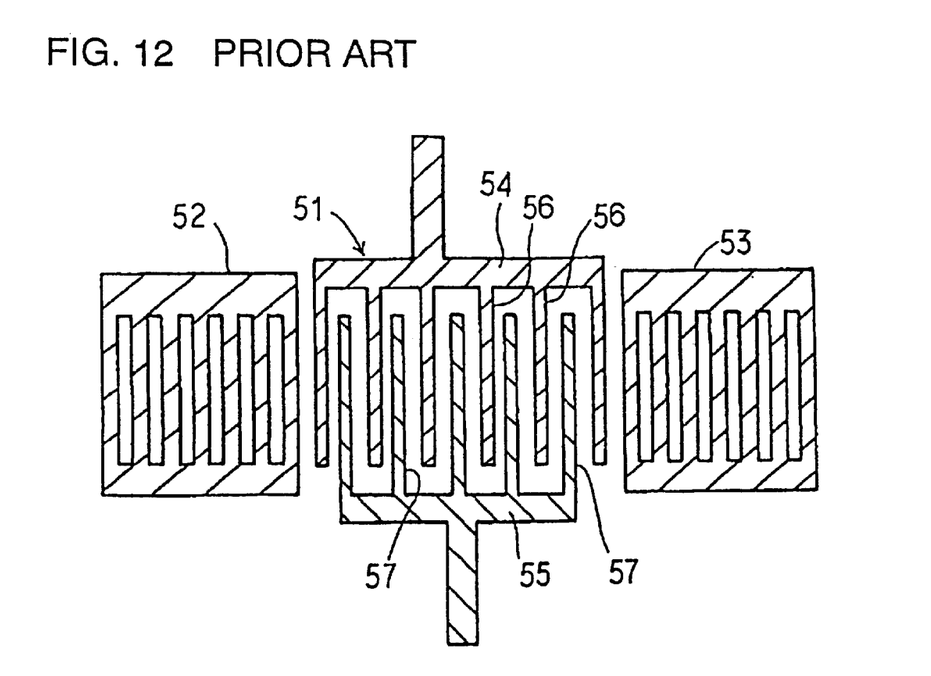
FIG. 12 is a plan view showing the electrode structure of a one-port SAW resonator used in the conventional SAW filter.

Referring to FIGS. 11 and 12, a description of the above-mentioned SAW filter having a ladder circuit structure will be provided. In the SAW filter of Figs. 11 and 12, a series arm for connecting an input end and an output end, and a parallel arm for connecting the series arm and a reference potential are provided. A one-port SAW resonator S1 defining a series-arm resonator is connected to the series arm, and a one-port SAW resonator P1 defining a parallel-arm resonator is connected to the parallel arm. In FIG. 11, only one series-arm resonator and one parallel-arm resonator are shown. However, the number of series-arm resonators and, parallel-arm resonators included in the filter is determined by the desired filter characteristics.

Referring to FIG. 12, the conventional one-port SAW resonator has an electrode structure such that an IDT 51 has a reflector 52 on a first side thereof and a reflector 53 on a second side thereof, all arranged on a piezoelectric substrate (not shown).

The IDT 51 has a pair of bus bars 54 and 55 which extend along a direction in which a surface acoustic wave propagates. The bus bar 54 is connected to one end of each of a plurality of electrode fingers 56. The electrode fingers 56 extend in a direction that is perpendicular to the direction in which a surface acoustic wave propagates, in other words, towards the bus bar 55 on the opposite. side of the bus bar 54. Similarly, the bus bar 55 is connected to one end of each of a plurality of electrode fingers 57. The electrode fingers 57 extend towards the bus bar 54. The electrode fingers 56 and 57 are arranged to be interdigitated with each other.

Figure 13:
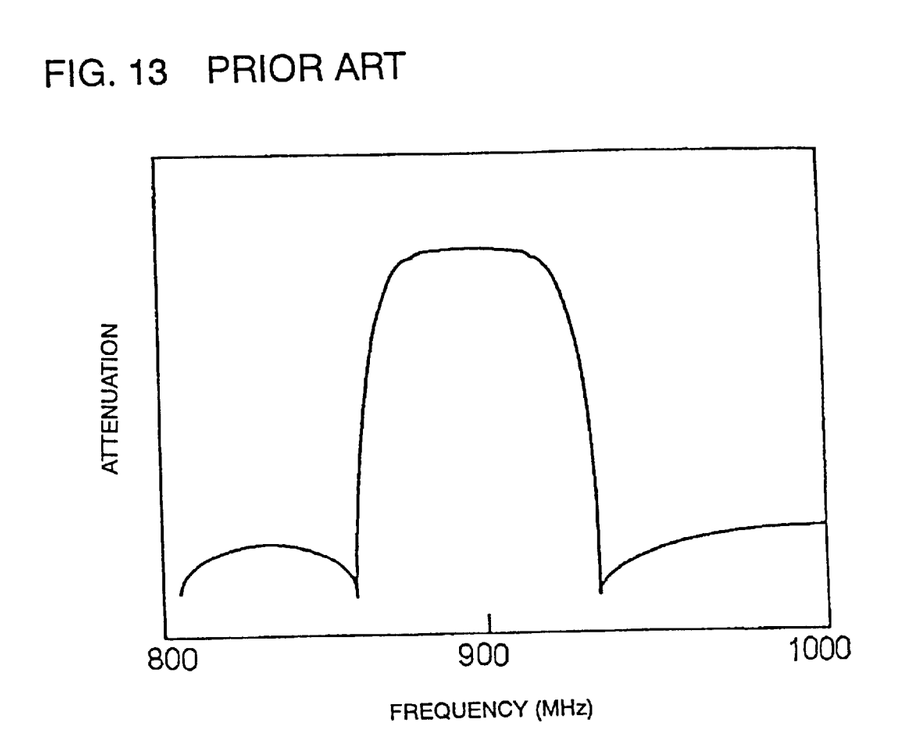
FIG. 13 is a graph showing the attenuation-frequency characteristics of the conventional SAW filter.

A plurality of the above one-port SAW resonators are arranged to constitute the ladder circuit as shown in FIG. 11, so as to define a SAW filter. FIG. 13 shows the attenuation-frequency characteristics of the SAW filter.

Since the SAW filter having the ladder circuit structure exhibits small loss and has a wide pass band, SAW filters have been widely used as band pass filters in cellular phones or other similar devices.

However, in recent years, cellular phones have been using a system in which a transmission-side frequency band and a reception-side frequency band are close to each other. Thus, band pass filters should now be able to increase the steepness of the filter characteristics when pass bands are close to each other.

Figure 14:
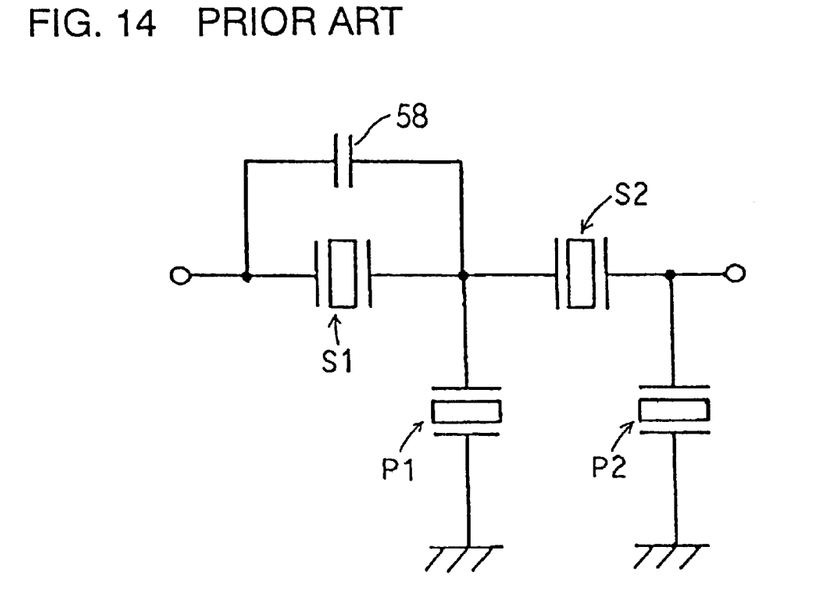
FIG. 14 is a circuit diagram for illustrating another conventional SAW filter.

Therefore, in order to increase the steepness of the filter characteristics, in Japanese Unexamined Patent Publication No. 9-167937, there is provided a SAW filter having a circuit structure as shown in FIG. 14. In this case, one-port SAW resonators S1 and S2 are connected to a series arm such that the SAW resonator S1 is connected in parallel to a capacitor 58. According to this conventional device, the addition of the capacitor 58 permits the anti-resonance frequency of the SAW resonator S1 to be decreased so that the steepness of the filter characteristics on the high-frequency side of the pass band can be increased.

However, since the method described in Japanese Unexamined Patent Publication No. 9-167937 requires the addition of the capacitor 58, the size of the SAW filter is increased, and thus, the conventional design is difficult to use if miniaturization of cellular phones or other similar devices is desired. Additionally, since more capacitance is added due to the capacitor 58 to the SAW resonator S1, the attenuation within frequency bands other than the pass band is reduced.

Note that in a SAW filter having the ladder circuit structure in which frequency bands are spaced from the pass band, attenuation is determined by the capacitance ratio of a parallel-arm resonator and a series-arm resonator. In general, when the capacitance of the series-arm resonator is increased, the attenuation is decreased. Consequently, as described above with respect to the conventional device, when the series-arm resonator S1 is connected in parallel to the capacitor 58, the attenuation outside of the pass band is deteriorated, as in the case in which the capacitance of the series-arm resonator is increased.

In order to prevent the above-described decrease in the. attenuation within the frequency bands which are spaced away from the pass band, a solution is to reduce the capacitance of the electrode of the series-arm resonator. However, when the capacitance of the electrode of the series-arm resonator is reduced, it is necessary to reduce the number of pairs of electrode fingers and the interdigitating width thereof, which leads to difficulties in obtaining desirable resonance characteristics.

SUMMARY OF THE INVENTION

To overcome the problems described above, preferred embodiments of the present invention provide a SAW filter that increases the steepness of the filter characteristics on the high-frequency side of a pass band while facilitating miniaturization of the filter, suppressing a decrease in the attenuation within frequency bands spaced away from the pass band, and achieving excellent resonance characteristics.

According to a preferred embodiment of the present invention a SAW filter includes a plurality of interdigital transducers arranged on the piezoelectric substrate so as to define a plurality of one-port SAW resonators, the plurality of one-port SAW resonators being connected so as to constitute a ladder circuit having a series arm and a parallel arm. Each of the plurality of the one port SAW resonators includes first and second comb electrodes. The first and second comb-shaped electrodes, each of which has a plurality of electrode fingers and a bus bar connected to first ends of the plurality of electrode fingers, are interdigitated with each other so that second ends of the plurality of electrode fingers of each of the first and second comb-shaped electrodes extend toward the bus bar of the other comb-shaped electrode to define the interdigital transducer. In the interdigital transducer of at least one of the plurality of one-port resonators, a gap between the bus bar of the first comb-shaped electrode and the second ends of the electrode fingers connected to the bus bar of the second comb-shaped electrode is within a range of about 0.50 λ to about 4 λ, where λ is a wavelength of a surface acoustic wave to be excited on the piezoelectric substrate.

In another preferred embodiment of the present invention, at least one one-port SAW resonator is preferably connected to the series arm of the ladder circuit. In this case, a ripple which is close to the pass band on the high-frequency side of the pass band is moved such that the steepness of the filter characteristics on the high-frequency side of the pass band is increased via the attenuation of the ripple.

In another preferred embodiment of the invention, the ladder circuit may have a plurality of series arms, and the gap as described above in the interdigital transducers on all of the series arms may preferably be set within the range of about 0.50 λ to about 4 λ. In this case, a synergistic effect of increasing the attenuation due to the ripple in each of the one-port SAW resonators connected at the series arms is achieved. Thus, excellent SAW filter characteristics including steeper filter characteristics at the high-frequency side of the pass band are achieved.

In another preferred embodiment of the present invention, if the one-port SAW resonator uses a $LiTaO_3$ substrate as the piezoelectric substrate, the above-mentioned ripple clearly appears between the resonance frequency and the anti-resonance frequency. Thus, the ripple can be effectively used to increase the attenuation so that the steepness of the filter characteristics when close to the pass band are greatly and efficiently increased.

In another preferred embodiment of the present invention, a method of manufacturing a SAW filter includes the steps of providing a piezoelectric substrate, forming a plurality of interdigital transducers on the piezoelectric substrate so as to form a plurality of one-port SAW resonators, each of the plurality of one port SAW resonators including first and second comb electrodes each including electrode fingers and a bus bar, wherein the plurality of one-port SAW resonators are connected so as to constitute a ladder circuit having a series arm and a parallel arm, and creating a gap between the bus bar of the first comb electrode and ends of the electrode fingers of the second comb electrode that is within a range of about 0.50 λ to about 4 λ within at least one of the interdigital transducers such that a ripple occurs within a pass band of the surface acoustic wave filter, where λ is a wavelength of a surface acoustic wave to be excited on the piezoelectric substrate.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given rein below and the accompanying drawings which are given by way of illustration only, and thus do not limit the present invention and wherein.

DETAILED DESCRIPTION OF PREFERRED EMBODIMENTS

Figure 1A:
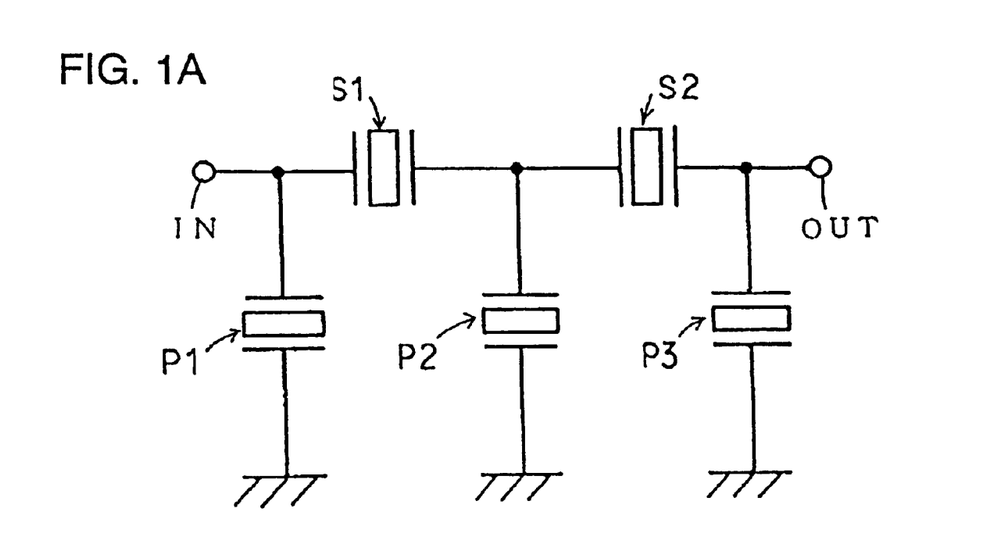
FIG. 1A is a circuit diagram of a SAW filter according to a preferred embodiment of the present invention.
Figure 1B:
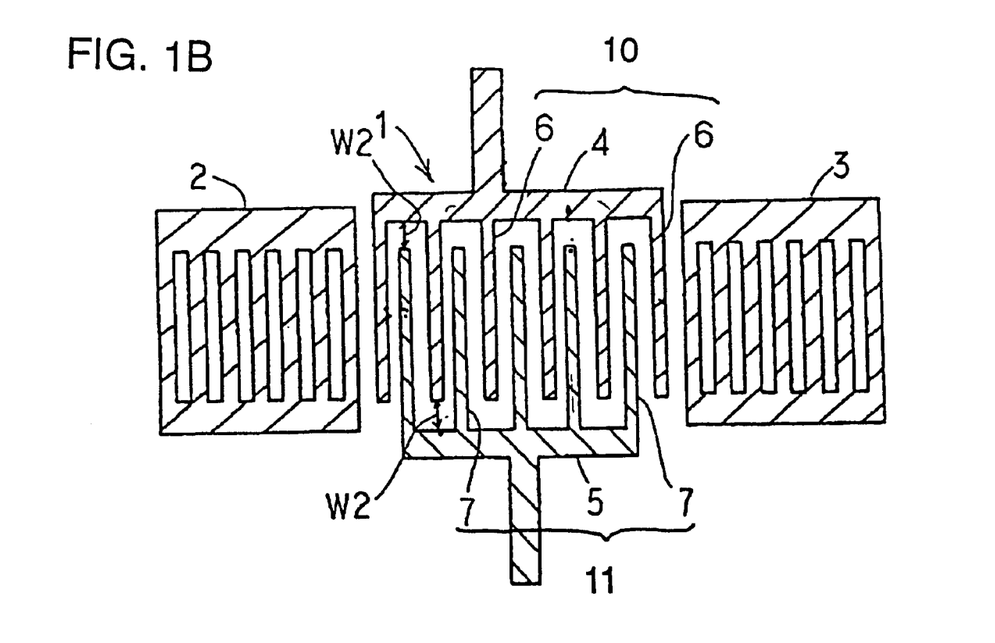
FIG. 1B is a plan view illustrating the electrode structure of a one-port SAW resonator used in the SAW filter of the preferred embodiment shown in FIG. 1A.

FIG. 1A shows a circuit structure of a SAW filter according to a preferred embodiment of the present invention. FIG. 1B is a plan view showing the electrode structure of a one-port SAW resonator included in the present preferred embodiment.

Referring to FIG. 1A, the SAW filter of the preferred embodiment has a ladder circuit structure. That is, a series arm is preferably located between an input end IN and an output end OUT, and a plurality of parallel arms are preferably located between the series arm and reference potentials.

One-port SAW resonators S1 and S2 are series-arm resonators which are connected to the series arm. Each of the one-port SAW resonators P1 to P3 are parallel-arm resonators which are connected to each of the parallel arms. In addition, as shown in Figure 1A, from the input end IN towards the output end OUT, the parallel-arm resonators and the series-arm resonators are alternately arranged. However, the number of series-arm resonators and parallel-arm resonators in the present invention should not be restricted to that of the preferred embodiment shown and any number or combination of series-arm resonators and parallel-arm resonators may be used. For example, it is possible to use a structure that has only one series-arm resonator and only one parallel-arm resonator or a structure that has three or more parallel-arm resonators.

Referring to FIG. 1B, a description of the electrode structure of the one-port SAW resonators S1, S2, P1 to P3 will be provided. In the one-port SAW resonator, reflectors 2 and 3 are preferably positioned on each side of the IDT 1, respectively, preferably in a direction in which a surface acoustic wave propagates in the IDT 1.

The IDT 1 preferably includes a pair of bus bars 4 and 5 arranged substantially parallel to each other with a fixed distance therebetween. One end of each of the plurality of electrode fingers 6 is connected to the bus bar 4, whereas one end of each of the plurality of electrode fingers 7 is connected to the bus bar 5. The electrode fingers 6 extend towards the bus bar 5, and the electrode fingers 7 extend towards the bus bar 4. The electrode fingers 6 and 7 are arranged so that they mutually interdigitate with each other.

The IDT 1 includes a pair of comb-shaped electrodes 10 and 11. The comb-shaped electrode 10 includes the plurality of electrode fingers 6 and the bus bar 4 connected to first ends of the electrode fingers 6. The comb-shaped electrode 11 includes the plurality of electrode fingers 7 and the bus bar 5 connected to first ends of the electrode fingers 7. The comb-shaped electrodes 10 and 11 preferably interdigitate with each other so that second ends of electrode fingers 6 or 7 of the comb-shaped electrode 10 or 11 extend toward the bus bar 5 or 4 of the comb-shaped electrode 11 or 10, respectively.

In addition, the reflectors 2 and 3 are preferably made of grating reflectors, in which both ends of a plurality of electrode fingers provided in the reflectors 2, 3 are preferably short-circuited.

In the one-port SAW resonator, when an AC voltage is applied between the electrode fingers 6 and 7, the IDT 1 becomes excited and a surface acoustic wave is generated. The surface acoustic wave is confined between the reflectors 2 and 3, so that the resonance characteristics based on the surface acoustic wave can be extracted.

According to the preferred embodiments of the present invention, in an IDT 1 of at least one of the one-port SAW resonators, which constitutes the SAW filter defining the ladder circuit, the gap W2 between the bus bar 4 or 5 of the comb-shaped electrode 10 or 11 and the second ends of the electrode fingers 7 or 6 connected to the bus bar 5 or 4 of the comb-shaped electrode 11 or 10 is preferably set to be in the range of about $0.50\,\lambda$ to about $4\,\lambda$, where $\lambda$ is the wavelength of a surface acoustic wave to be excited on the piezoelectric substrate. This unique arrangement greatly increases the steepness of the filter characteristics on the high-frequency side of the pass band. How this occurs will be explained below.

Figure 15:
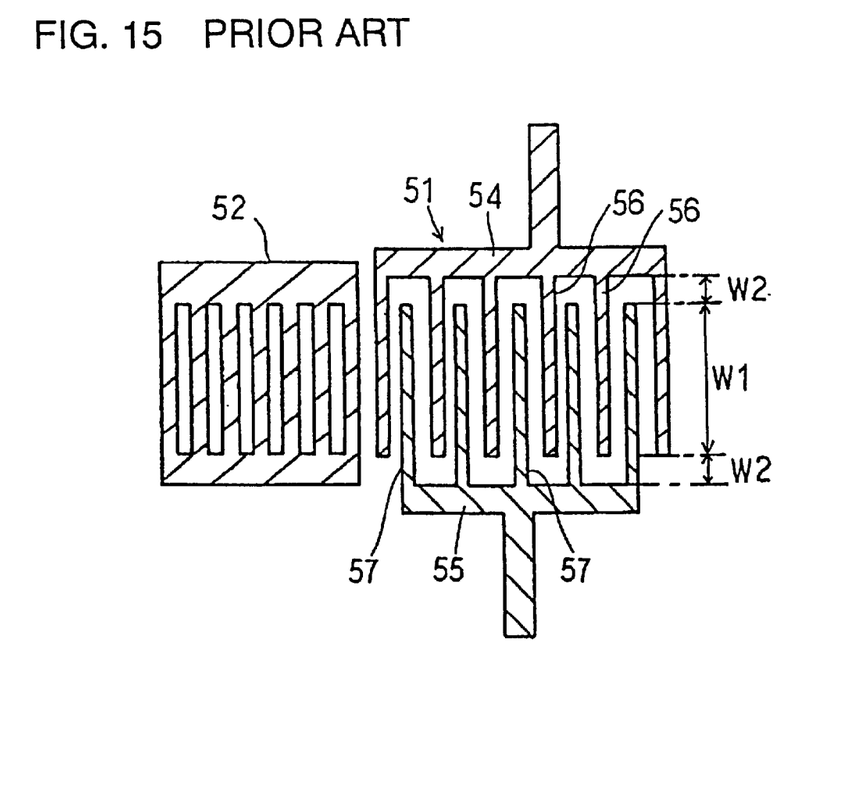
FIG. 15 is a plan view for illustrating the relationship between the gap length and the interdigitating width of the electrode fingers in the conventional one-port saw resonator.

In Japanese Unexamined Patent Publication No. 6-232682, there is disclosed a method for reducing a ripple existing between a resonance frequency and an anti-resonance frequency in the one-port SAW resonator using a piezoelectric substrate made of $LiTaO_3$. FIG. 15 shows, the electrode structure of the one-port SAW resonator described in the conventional art. It should be pointed out that, in FIG. 15, a reflector 52 disposed on one side of an IDT 51 is shown, but a reflector disposed on the other side of IDT 51 is not shown.

In the conventional art, it is disclosed that the influence of a ripple existing between a resonance frequency and an anti-resonance frequency, peculiar to the $LiTaO_3$ substrate, can be decreased when the ratio W1/W2 is increased. In other words, making the gap length W2 smaller than the interdigitating width W1 reduces the occurrence of a surface skimming bulk wave (SSBW) so that the influence of the above ripple is decreased.

As described in the above conventional art, the occurrence of SSBW is considered to be undesirable because it deteriorates the characteristics of a SAW resonator, and so it is therefore desirable to make the gap length W2 as small as possible.

In contrast, the preferred embodiments of present invention use the ripple as much as possible, so that unexpected improvements in the filter characteristics are achieved. In other words, preferred embodiments of the present invention use the ripple in a positive manner in contrast to conventional wisdom and devices which attempt to suppress the ripple from occurring.

The present invention provides empirical evidence that, in the one-port SAW resonator, fixing the interdigitating width W1 and changing only the gap length W2 allows the frequency of the ripple to be easily controlled.

Figure 2:
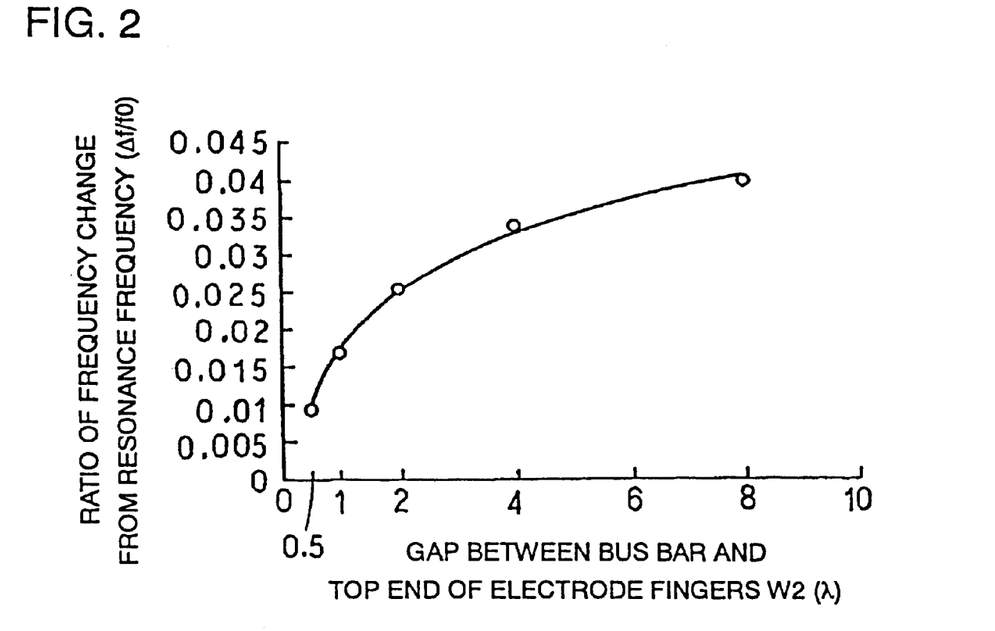
FIG. 2 is a graph showing the relationship between the gap length W2 between a bus bar and a top end of the electrode fingers in a one-port SAW resonator, and the frequency position of a ripple between a resonance frequency and an anti-resonance frequency in a preferred embodiment.

Referring to FIG. 2, the graph shows the relationship between the gap length W2 in the one-port SAW resonator and the frequency of the ripple occurring between the resonant frequency and the anti-resonant frequency. The frequencies $\Delta f/f0$ indicated by the vertical axis are standardized values, where $\Delta f$ measures the difference between the frequency at which a ripple occurs and the resonance frequency f0 of the surface acoustic wave device. As shown in FIG. 2, changing the gap length W2 changes the frequency at which the ripple occurs.

So, in the SAW filter having a ladder circuit structure, desired excellent filter so characteristics are achieved by combining the resonance characteristics of a plurality of one-port SAW resonators. Accordingly, by moving the ripple to a frequency where it is necessary to increase the attenuation, the ripple increases: the attenuation at that frequency. Note that in the ladder circuit structure, when the gap length W2 is changed especially in the one-port SAW resonators defining the series-arm resonators, the frequency at which the ripple occurs can be moved to the frequency near the shoulder of the high-frequency side of the pass band of the SAW filter. As a result, the steepness of the filter characteristics on the high-frequency side of the pass band are greatly increased.

Next, a description concerning how changes in the gap length W2 of the series-arm resonator effect the pass band characteristics on its high-frequency side will be provided.

Figure 3:
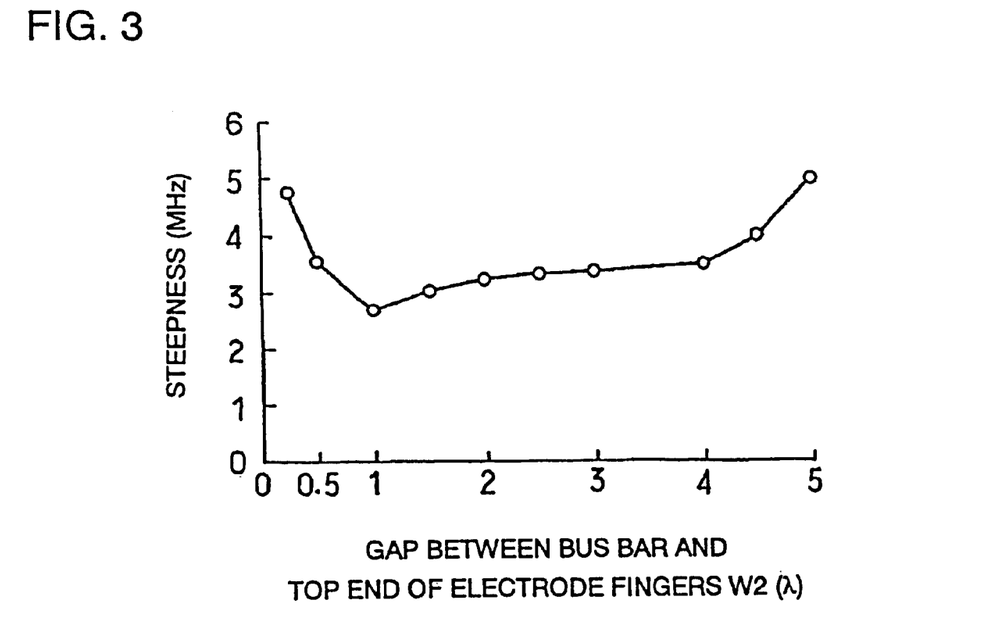
FIG. 3 is a graph showing the relationship between the gap length W2 between the bus bar and a top end of the electrode fingers in a one-port SAW resonator and the steepness of the filter characteristics on the high-frequency side of the pass band in a preferred embodiment.
Figure 4:
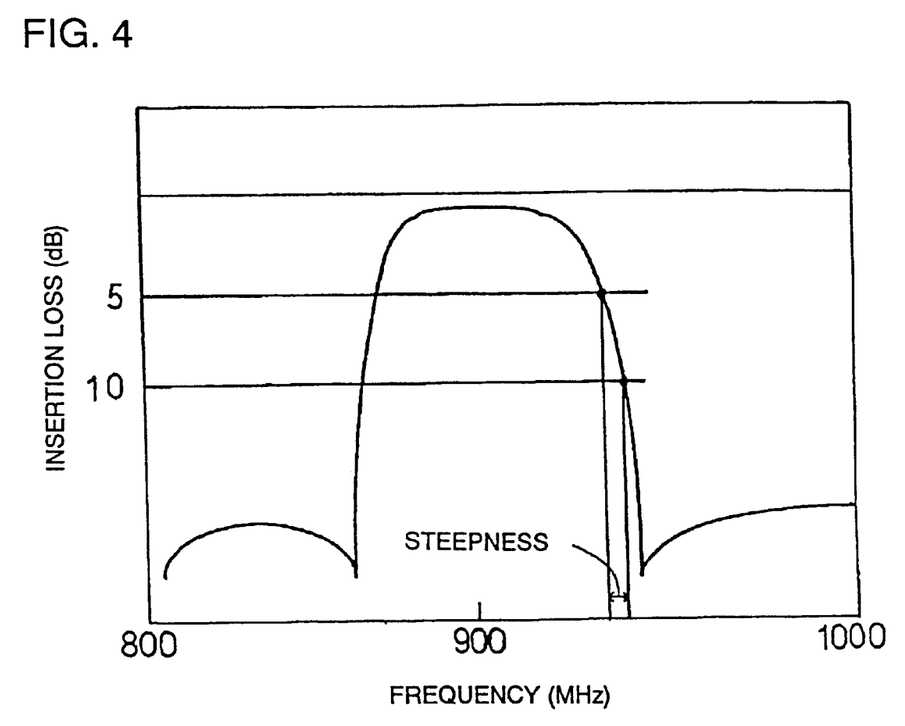
FIG. 4 is a graph showing the attenuation-frequency characteristics of a SAW filter illustrating the steepness of the filter characteristics as shown in FIG. 3.

Referring to FIG. 3, the graph shows changes in the steepness on the high-frequency side of the pass band of the SAW filter when the gap length W2 is changed in the one-port SAW resonators S1 and S2 defining the series-arm resonators in the SAW filter. The steepness (a unit thereof is indicated in MHz) of the filter characteristics near the pass band is defined as follows. Referring to FIG. 4, on the high-frequency side of the pass band, the difference between the frequency where attenuation is 5 dB and where attenuation is 10 dB is equivalent to the steepness of the filter characteristics. Thus, the smaller the difference in frequencies, (MHz), the steeper the filter characteristics.

So, FIG. 3 shows that there is a relationship between the gap length W2 in the one-port SAW resonator and the steepness of the filter characteristics on the high-frequency side of the band pass. If the gap length is about 0.50 λ or more, the steepness of the filter characteristics is increased sharply.

Therefore, in the preferred embodiments, in which a plurality of one-port SAW resonators are connected in a ladder arrangement, if the gap length W2 in the one-port SAW resonator defining the series-arm resonator is about 0.50 λ or more, the steepness on the high-frequency side of the pass band is greatly increased. However, when the gap length W2 is greater than about 4 λ, as shown in FIG. 3, the increase in steepness starts to decrease. Thus, the steepness on the high-frequency side is greatest when the gap length W2 is in the range of about 0.50 λ to about 4 λ.

Next, a description of the detailed experimental examples of the SAW filter of preferred embodiments of the present invention will be provided.

1. First Experimental Example

A LiTaO3 substrate, which is of 36°Y-cut X-propagation, is used as a piezoelectric substrate. Individual one-port SAW resonators and electrodes connected thereto are provided on the substrate. Al is used to form the one-port SAW resonators and for connecting the electrodes.

The one-port SAW resonators S1 and S2 defining series-arm resonators and the one-port SAW resonators P1 and P2 defining parallel-arm resonators are respectively formed as follows.

(1) The one-port SAW resonators S1 and S2 (series-arm resonators)

The number of pairs of electrode fingers equals 80, the interdigitating width of the electrode fingers is about 40 μm (10.5 λ), the gap length W2 in; the IDT is about 1.0 λ, and the number of electrode fingers in the reflector equals 100.

(2) The one-port SAW resonators P1 and P3 (parallel-arm resonators)

The number of pairs of electrode fingers equals 40, the interdigitating width, of the electrode fingers is about 80 μm (20 λ), the number of the electrode fingers in a reflector equals 100, and the gap length W2 is about 0.25 λ.

(3) The one-port SAW resonator P2 (a parallel-arm resonator)

The number of pairs of electrode fingers equals 80, the insterdigitating width of the electrode fingers is about 200 μm (50 λ), the number of the electrode fingers in a reflector equals 100, and the gap length W2 is about 0.25 λ.

Figure 5:
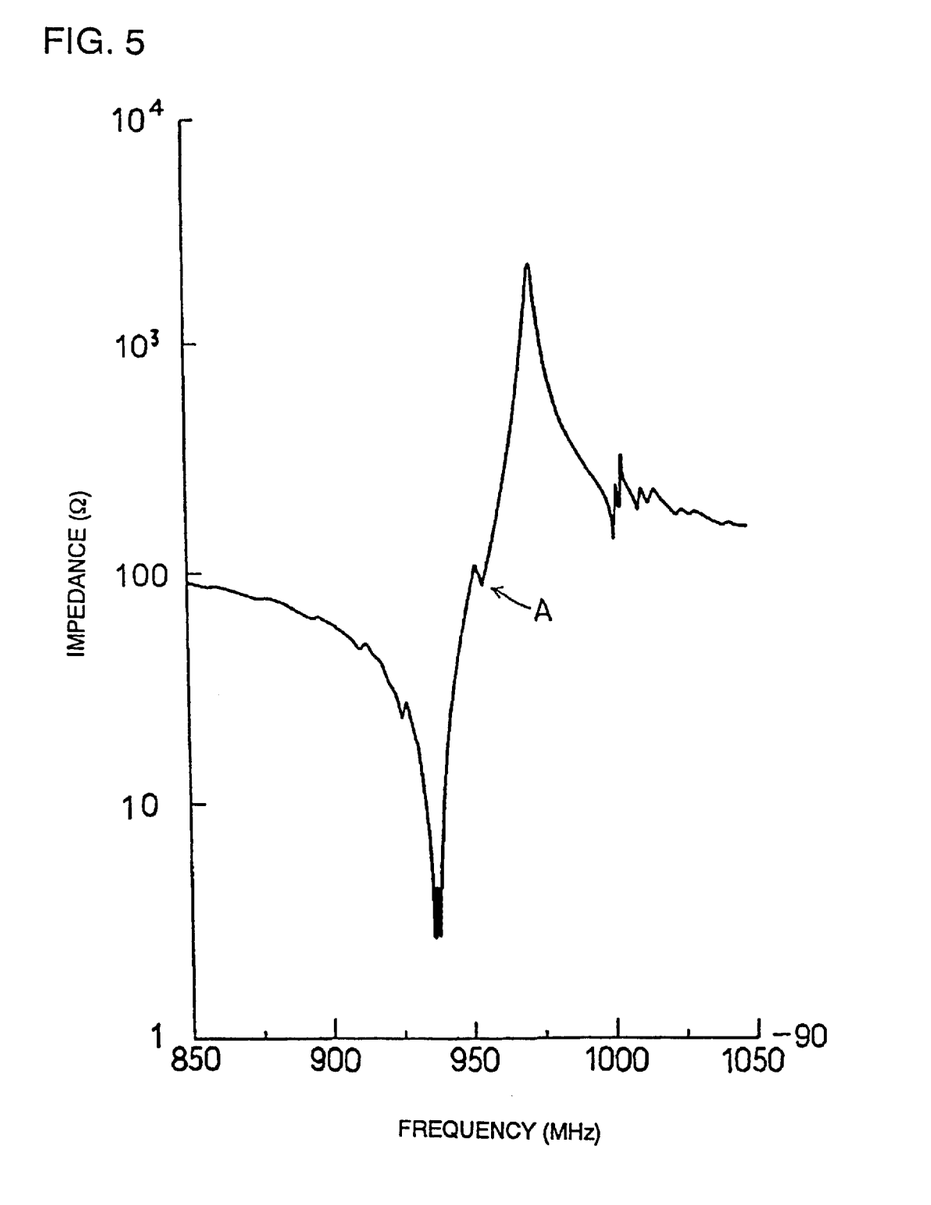
FIG. 5 is a graph showing the impedance-frequency characteristics of the SAW filter of a one-port SAW resonator used as a series-arm resonator according to a first experimental example of preferred embodiments of the present invention.

Referring to FIG. 5, the graph shows the impedance-frequency characteristics of the one-port SAW resonators S1 and S2 (series-arm resonators), which are formed as described above. As seen in FIG. 5, a ripple indicated by an arrow A is present between a resonance frequency and an anti-resonance frequency. In preferred embodiments of the present invention, moving the ripple A toward the high-frequency side of the pass band in the SAW filter greatly increases the steepness on the high-frequency side of the pass band.

Figure 6:
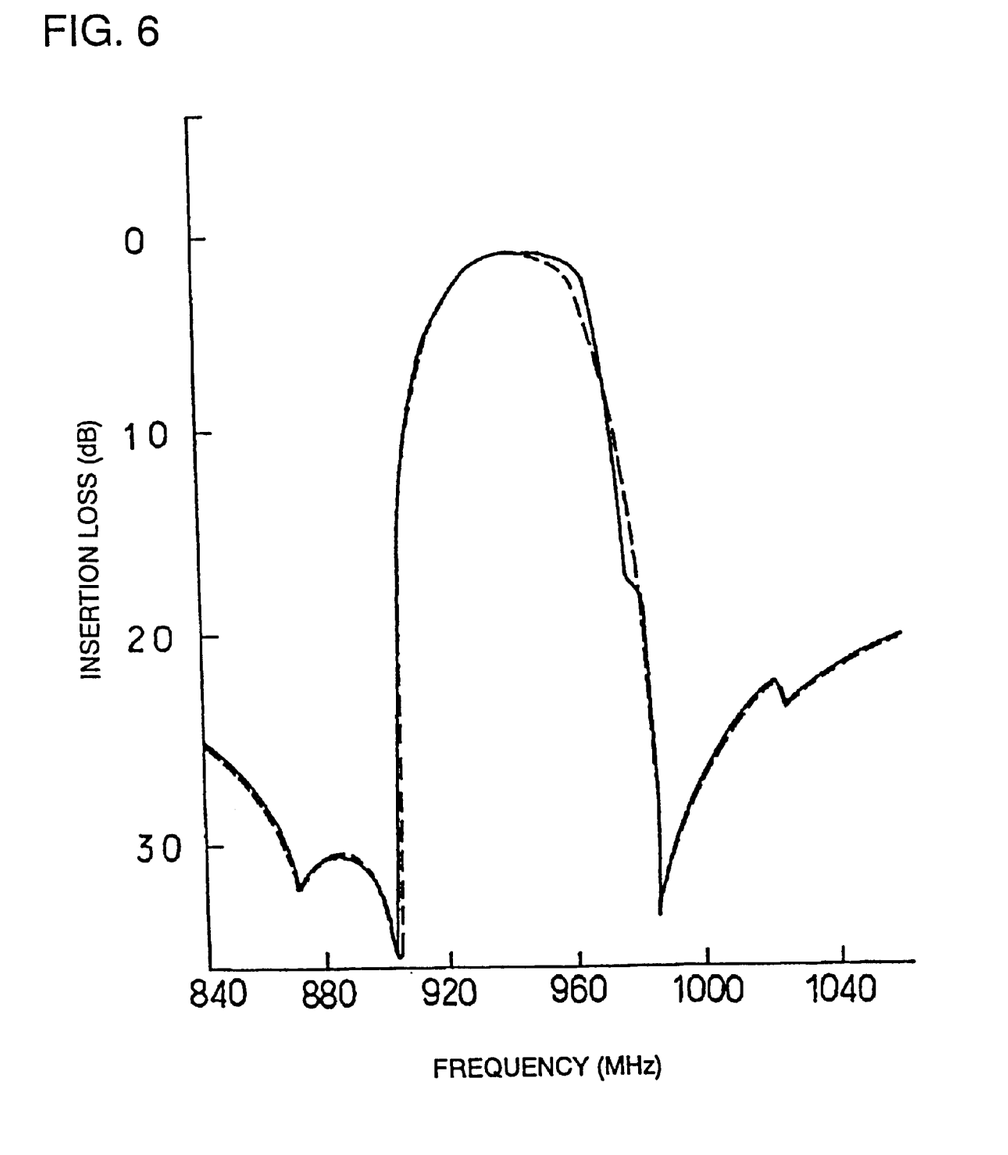
FIG. 6 is a graph showing the attenuation-frequency characteristics of the SAW filter of the first experimental example of preferred embodiments of the present invention and that of a SAW filter prepared for comparison to preferred embodiments of the present invention.

Referring to FIG. 6, the attenuation-frequency characteristics of the SAW filter, formed as described above, is indicated by the solid line. For comparison, the broken line indicates the filter characteristics of a SAW filter formed in the same way as the above-described first experimental example, except that the gap length W2 in the one-port SAW resonators S1 and S2 (series-arm resonators) is set to be about 0.25 λ. As shown in FIG. 6, in the first experimental example, because the gap length W2 in the one-port SAW resonators S1 and S2 is set at about 1.0 λ, the steepness on the high-frequency side of the pass band is much greater than the steepness in the example provided for comparison.

2. Second Experimental Example

The SAW filter is produced in the same way as in the first experimental example, except that the structures of the one-port SAW resonators S1 and S2 and the one-port SAW resonators P1 to P3 as the parallel-arm resonators are changed as below.

(1) The one-port SAW resonators S1 and S2 (series-arm resonators)

The number of pairs of electrode fingers equals 80, the interdigitating width of the electrode fingers is about 40 μm (10.5 λ), the gap length W2 is about 2.0 λ, and the number of the electrode fingers in the reflector equals 100.

(2) The one-port SAW resonators P1 and P3 (parallel-arm resonators)

The number of pairs of electrode fingers equals 40, the interdigitating width of the electrode fingers is about 80 μm (20 λ), and the number of electrode fingers in the reflector equals 100.

(3) The one-port SAW resonator P2 (a parallel-arm resonator)

The number of pairs of electrode fingers equals 80, the interdigitating width of the electrode fingers is about 200 μm (50 λ), the gap length W2 is about 0.25 λ, and the number of electrode fingers in the reflector equals 100.

Figure 7:
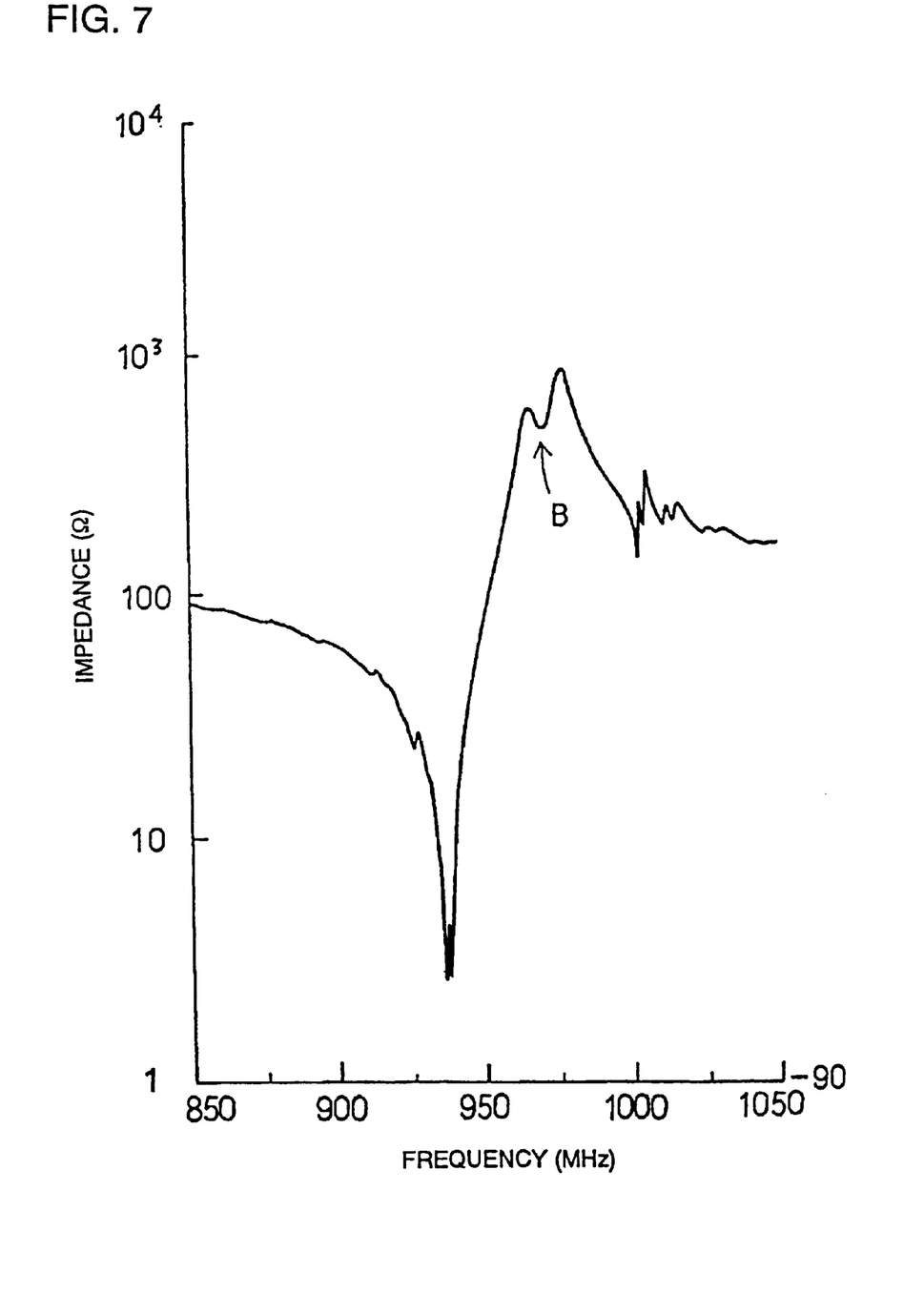
FIG. 7 is a graph showing the impedance-frequency characteristics of a one-port SAW resonator used as a series-arm resonator according to a second experimental example of preferred embodiments of the present invention.

Referring to FIG. 7, the graph shows the impedance-frequency characteristics of the one-port SAW resonator S1 as the series-arm resonator of the SAW filter according to the second experimental example. In FIG. 7, a ripple indicated by an arrow B is present near the anti-resonance frequency. Moving the ripple B toward the high-frequency side of the pass band in the SAW filter greatly increases the steepness on the high-frequency side of the pass band.

Figure 8:
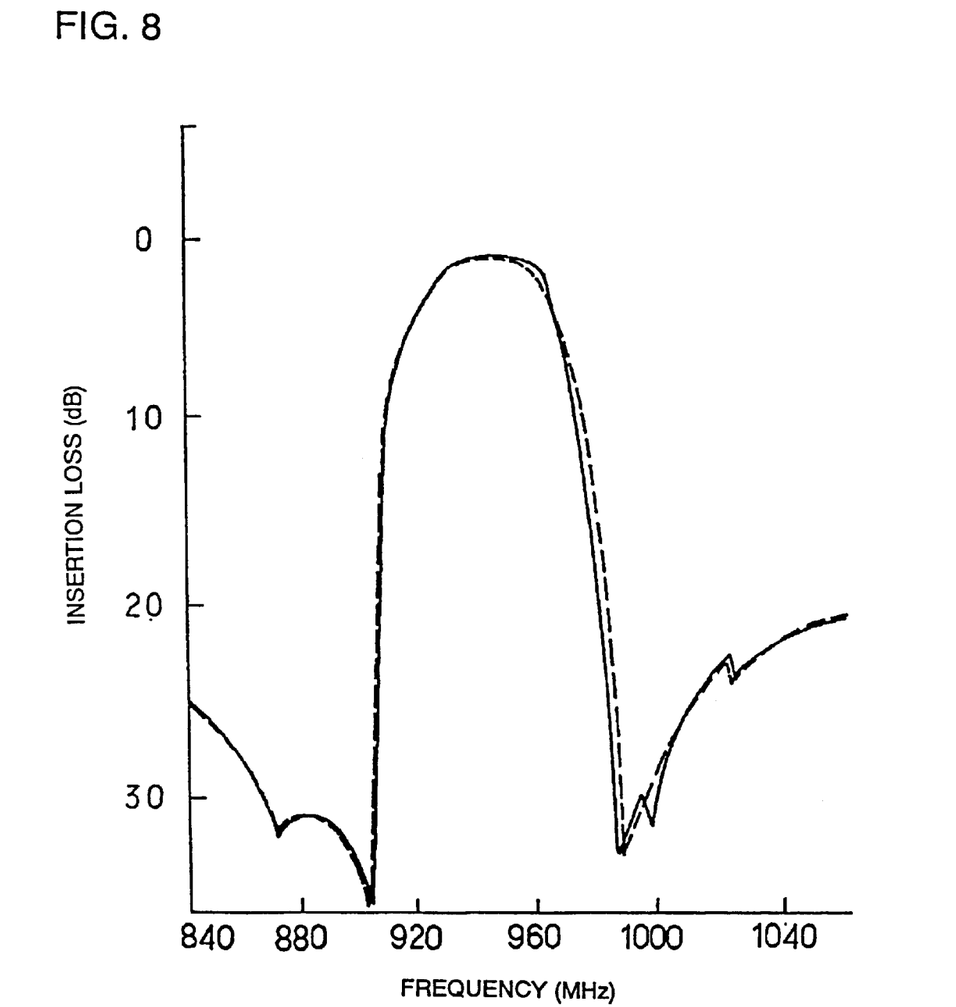
FIG. 8 is a graph showing the attenuation-frequency characteristics of the SAW filter of the second experimental example of preferred embodiments of the present invention and that of a SAW filter prepared for comparison to the preferred embodiments of the present invention.

Referring to FIG. 8, the solid line indicates the attenuation-frequency characteristics of the SAW filter according to the second experimental example. The broken line shows the attenuation-frequency characteristics of the SAW filter prepared for comparison in the first experimental example. It was discovered that even in the second experimental example, the steepness is greatly increased on the high-frequency side of the pass band when the gap length W2 of the one-port SAW resonators S1 and S2 is about 2.0 λ.

From the comparisons, as shown in FIGS. 6 and 8, in the SAW filter according to the second experimental example, the steepness on the high-frequency side of the pass band is slightly less very near the pass band as compared to the SAW filter of the first experimental example. However, although the steepness very. near the pass band is slightly less, the steepness within the higher-frequency side is greater in the SAW filter according to the second experimental example. This is so probably because the frequency of the ripple of the one-port SAW resonators S1 and S2 defining the series-arm resonators is higher in the second experimental example than in the first experimental example. Thus, the attenuation is increased at the ripple frequency.

Further, although the LiTaO$_3$ substrate of a 36°Y-cut X-propagation is used in the first and second experimental examples, even when a LiTaO$_3$ substrate with a cutting angle other than 36° is used, the same advantages as in the examples described above can be obtained. Also, in the present invention, other piezoelectric materials can be used. More specifically, a piezoelectric single crystal substrate made of $LiTaO_3$, $LiNbO_3$, or other materials can be used. Alternatively, a substrate made of piezoelectric ceramic materials, such as lead zirconate or lead titanate, can also be used. In addition, a piezoelectric substrate produced by laminating a piezoelectric thin film on an insulating substrate, made from an insulating material such as alumina, may also be used. If an insulating substrate is used, the electrodes of the IDT and the reflectors can be formed on either the upper surface or the lower surface of the piezoelectric thin film. However, a $LiTaO_3$ substrate should preferably be used as the piezoelectric substrate.

Additionally, as long as the gap length in at least one of the series-arm resonators is set to be about 0.50 λ or more, the ripple occurring between the resonance frequency and the anti-resonance frequency in the series-arm resonator can be used to greatly increase the steepness on the high-frequency side of the pass band. Therefore, in preferred embodiments of the present invention, the steepness is greatly increased as long as the gap length W2 of at least one of the SAW resonators defining the series-arm resonators is between about 0.50 λ to about 4 λ.

Furthermore, the present invention is not limited to the series-arm resonators. When the gap length W2 of the one-port SAW resonator defining the parallel-arm resonator is preferably between about 0.50 λ and about 4 λ as well, changing the frequency of the ripple also greatly increase the steepness near the pass band.

Therefore, in preferred embodiments of present invention, a capacitor in parallel with a one-port SAW resonator is not needed, so that reduction in size thereof is facilitated, and thus, deterioration of the attenuation in the frequency bands spaced away from the pass band is prevented.

The present invention can be suitably applied to various electronic components or devices utilizing a surface acoustic wave filter. A duplexer and a communication apparatus having a duplexer constitute examples of applications in which the unique features of the present invention are successfully used.

Figure 9:
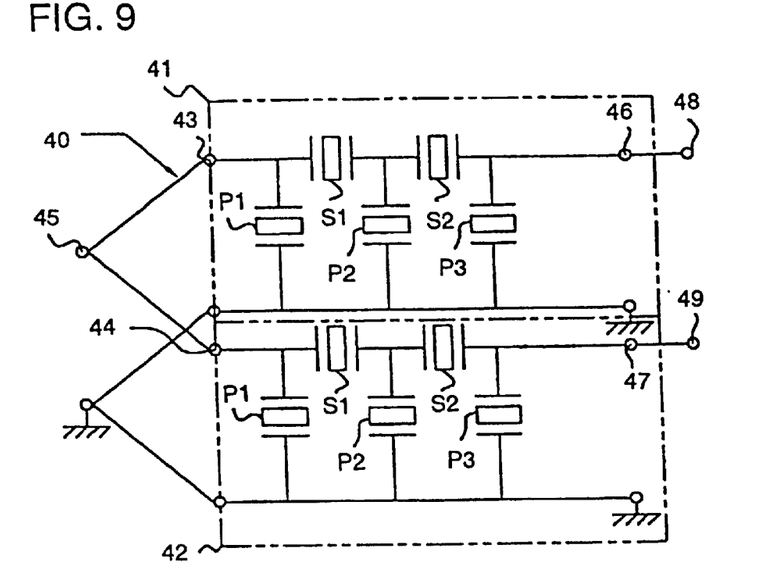
FIG. 9 is a circuit diagram showing a duplexer according to another preferred embodiment of the present invention.

As shown in FIG. 9, a duplexer 40 preferably includes a first SAW filter 41 and a second SAW filter 42 having different center pass band frequencies. The SAW filters 41 and 42 shown in FIG. 9 are preferably the same as the SAW filter shown in FIG. 1A, but other SAW filters according to various preferred embodiments of the present invention may be included. In the duplexer 40, an input terminal 43 of the SAW filter 41 and an input terminal 44 of the SAW filter 42 are electrically connected to a first input/output terminal 45 of the duplexer 40. The ground terminals of the SAW filters 41 and 42 are commonly connected so as to be grounded. The output terminal 46 of the SAW filter 41 and the output terminal 47 of the SAW filter 42 are respectively connected to a second input/output terminal 48 and third input/output terminal 49 of the duplexer 40.

The duplexer 40 has excellent signal selectivity because the SAW filters 41 and 42 have increased steepness at the high end of the pass band thereof. In addition, since other components such as capacitors are not required, the duplexer 40 has a greatly reduced size.

Figure 10:
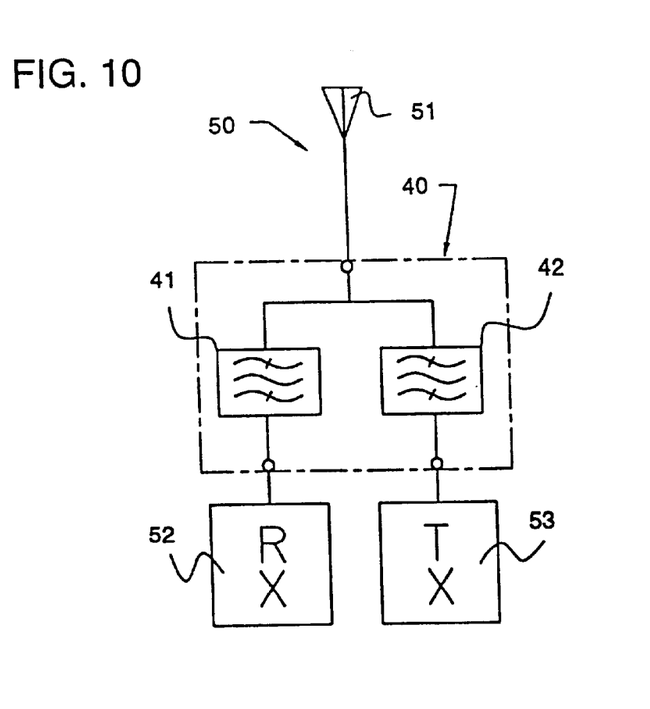
FIG. 10 is a block diagram showing a communication apparatus according to still another preferred embodiment of the present invention.

FIG. 10 is a block diagram of a communication apparatus 50 including the duplexer 40. The communication apparatus 50 may be a cellular phone, for example, as a cellular phone which usually requires a narrow communication band and a small-size body is suitable to using the aforementioned advantages of the duplexer 40. The communication apparatus 50 preferably includes an antenna 51, a receiver 52 and a transmitter 53 connected to the first, second and third input/output terminals of the duplexer 40. The pass bands of the SAW filters 41 and 42 of the duplexer 40 are selected such that the signals received through the antenna 51 pass through the SAW filter 41 and are blocked by the SAW filter 42 and such that the signals to be transmitted from the transmitter 53 pass through the SAW filter 42.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a surface acoustic wave filter comprising the steps of:

providing a piezoelectric substrate;

forming a plurality of interdigital transducers arranged on the piezoelectric substrate so as to define a plurality of one-port SAW resonators, the plurality of one-port SAW resonators being connected so as to constitute a ladder filter having a series arm and a parallel arm, each of the plurality of interdigital transducers including first and second comb-shaped electrodes each of which has a plurality of electrode fingers and a bus bar connected to first ends of the plurality of electrode fingers, the first and second comb-shaped electrodes interdigitating with each other so that second ends of the plurality of electrode fingers of the first comb-shaped electrodes extend toward the bus bar of the second comb-shaped electrode to define the respective interdigital transducer; and creating a gap in at least one of the plurality of interdigital transducers such that the gap exists between the bus bar of the first comb-shaped electrode and the second ends of the electrode fingers connected to the bus bar of the second comb-shaped electrode, and the gap width being within a range of about 0.50 λ to about 4λ, where λ is a wavelength of a surface acoustic wave to be excited on the piezoelectric substrate; wherein a ripple occurs at a shoulder of a high frequency side of the pass band.

2. The method according to claim 1, wherein the piezoelectric substrate is a $LiTaO_3$ substrate.

3. The method according to claim 1, wherein the ladder circuit has a plurality of series-arms, and the gap in the interdigital transducers of all of the series-arms is within the range of about 0.50 λ to about 4 λ.

4. The method according to claim 1, wherein the ladder circuit has a plurality of series arms, wherein the gap in the interdigital transducer of at least one of the series arms is within the range of about 0.50 λ to about 4 λ.

5. The method according to claim 1, wherein the ladder circuit has a plurality of parallel arms, wherein the gap in the interdigital transducer of at least one of the parallel arms is within the range of about 0.50 λ to about 4 λ.

* * * * *

UNITED STATES PATENT AND TRADEMARK OFFICE
CERTIFICATE OF CORRECTION

PATENT NO.     : 6,518,861 B2
DATED          : February 11, 2003
INVENTOR(S)    : Norio Taniguchi It is certified that error appears in the above-identified patent and that said Letters Patent is hereby corrected as shown below:

<u>Title page,</u>
Item [62], should read:
-- Division application No. 09/435,580, filed on
Nov. 8, 1999, now Pat. No. 6,265,808. --

Signed and Sealed this

Twenty-sixth Day of August, 2003

JAMES E. ROGAN
*Director of the United States Patent and Trademark Office*